(12) United States Patent
Gopalakrishnan et al.

(10) Patent No.: US 9,287,003 B2
(45) Date of Patent: Mar. 15, 2016

(54) MULTI-CYCLE WRITE LEVELING

(71) Applicant: RAMBUS INC., Sunnyvale, CA (US)

(72) Inventors: Liji Gopalakrishnan, Sunnyvale, CA (US); Mahabaleshwara Mahabaleshwara, Udupi (IN)

(73) Assignee: Rambus Inc., Sunnyvale, CA (US)

( * ) Notice: Subject to any disclaimer, the term of this patent is extended or adjusted under 35 U.S.C. 154(b) by 0 days.

(21) Appl. No.: 14/325,140

(22) Filed: Jul. 7, 2014

(65) Prior Publication Data
US 2015/0162061 A1 Jun. 11, 2015

Related U.S. Application Data

(60) Provisional application No. 61/913,135, filed on Dec. 6, 2013.

(51) Int. Cl.
G11C 7/00 (2006.01)
G11C 29/02 (2006.01)
G06F 11/10 (2006.01)
G06F 11/14 (2006.01)

(52) U.S. Cl.
CPC .......... *G11C 29/023* (2013.01); *G06F 11/1076* (2013.01); *G06F 11/14* (2013.01); *G11C 29/021* (2013.01); *G11C 29/022* (2013.01); *G11C 29/028* (2013.01)

(58) Field of Classification Search
CPC ................ G06F 11/1076; G06F 11/14; G06F 2212/1032
USPC .................. 365/194, 185.09, 185.11, 185.22, 365/189.011, 189.14, 189.07, 230.01, 365/189.09
See application file for complete search history.

(56) References Cited

U.S. PATENT DOCUMENTS

| 6,043,682 | A | * | 3/2000 | Dabral et al. | 326/86 |
| 8,879,185 | B1 | * | 11/2014 | Zou et al. | 360/51 |
| 2013/0094283 | A1 | * | 4/2013 | Berger et al. | 365/158 |
| 2015/0066819 | A1 | * | 3/2015 | Mozak et al. | 706/12 |
| 2015/0149856 | A1 | * | 5/2015 | Wu et al. | 714/759 |

* cited by examiner

*Primary Examiner* — Fernando Hidalgo
(74) *Attorney, Agent, or Firm* — Lowenstein Sandler LLP

(57) ABSTRACT

A memory controller includes logic to determine corresponding reference voltage values and delay values for one or more memory devices. The memory controller includes a command-address (CA) interface to send a command to a memory device to set a reference voltage value of the memory device to a test value, a data interface to write a data pattern to the memory device and read the data pattern from the memory device, and test reference voltage logic to perform a density check on at least a portion of the data pattern read from the memory device and determine whether the test value is a potential reference voltage value based on the density check. An operational reference voltage value selected from one or more potential reference voltage values may be used to determine a delay value.

20 Claims, 8 Drawing Sheets

| SHIFT (BITS) | DATA PATTERN |
|---|---|
| 0 | 00000000 11111111 |
| 1 | 00000001 1111111X |
| 2 | 00000011 111111XX |
| 3 | 00000111 11111XXX |
| 4 | 00001111 1111XXXX |
| 5 | 00011111 111XXXXX |
| 6 | 00111111 11XXXXXX |
| 7 | 01111111 1XXXXXXX |

Figure 5

MULTI-CYCLE WRITE LEVELING

CROSS-REFERENCE TO RELATED APPLICATIONS

This application is a non-provisional application that claims priority to U.S. Provisional Patent App. No. 61/913,135, filed on Dec. 6, 2013, and hereby incorporated by reference.

BACKGROUND

Computing memory systems generally comprise one or more dynamic random access memory (DRAM) integrated circuits, referred to herein as DRAM devices, which are connected to one or more processors. Multiple DRAM devices may be arranged on a memory module, such as a dual in-line memory module (DIMM). A DIMM includes a series of DRAM devices mounted on a printed circuit board (PCB) and are typically designed for use in personal computers, workstations, servers, or the like. There are different types of memory modules, one example being a load-reduced DIMM (LRDIMM). Memory capacity and/or bandwidth may be limited by the loading of the data (DQ) bus and the command-address (CA) bus associated with many DRAM devices and DIMMs. LRDIMMs allow a somewhat increased memory capacity by using memory buffers (sometimes also referred to as registers) on each DIMM to buffer memory channel signals. Registered memory modules have a register between the DRAM devices and the system's memory controller. For example, a fully buffered DIMM architecture introduces an advanced memory buffer (AMB) between the memory controller and the DRAM devices on the DIMM. The memory controller communicates with the AMB as if the AMB were a memory device, and the AMB communicates with the DRAM devices as if the AMB were a memory controller. The AMB can buffer data, command and address signals. With this architecture, the memory controller does not communicate with the DRAM devices directly, rather the AMB is an intermediary for communication with the DRAM devices.

BRIEF DESCRIPTION OF THE DRAWINGS

The present embodiments are illustrated by way of example, and not of limitation, in the Figures of the accompanying drawings in which:

FIG. 3 shows an example low-frequency data pattern that may be written to the memory device and various examples of the read data pattern that may be read from the memory device.

FIG. 5 shows an example look-up data for the written data pattern of FIG. 3.

DETAILED DESCRIPTION

Described herein in various embodiments is a memory system including a memory controller and one or more memory devices (i.e., integrated circuit devices) In at least one embodiment, a reference voltage value for a memory device and a delay value associated with the memory device is determined. The reference voltage value may be used by a receiver of the memory device to amplify the data (e.g., determine whether a voltage associated with a bit of data received by the memory device is a '1' or a '0'. The delay value may be used to levelize arrival times of data bits at multiple memory devices. Throughout this description, levelizing the arrival time of data bits may also be referred to as "synchronizing" data.

In some embodiments, determining a delay value depends on the corresponding reference voltage value being correctly set. Similarly, determining a reference voltage value using a generic pattern of data depends on the delay being known. Thus, described herein is a method in which a reference voltage value of a memory device is set to a test value, a low-frequency data pattern is written to and read from the memory device, and a density check is performed on at least a portion of the low-frequency data pattern as read from the memory device. Whether the test value is a potential reference voltage value may be determined based on the density check. An operational reference voltage value may be selected from one or more test values that have been determined as potential reference voltage values. The operational reference voltage value for the memory device may be used to determine a delay value for the memory device.

Figure 1:
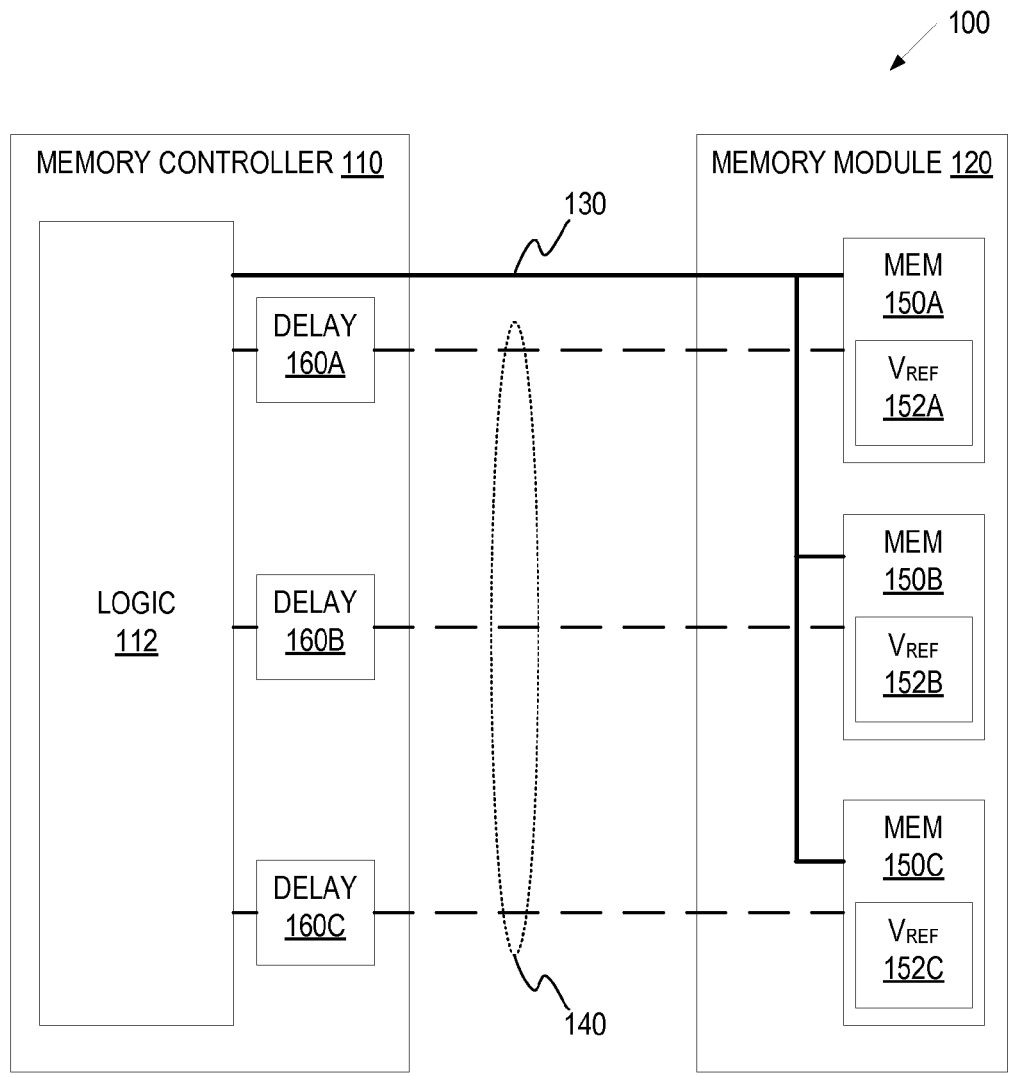
FIG. 1 is a functional block diagram of a memory system.

FIG. 1 is a functional block diagram of a memory system 100. The memory system 100 includes a memory controller 110 that communicates with a memory module 120 via a command-address (CA) interface 130 and a data (DQ) interface 140. The memory controller 110 may be linked with the memory module 120 via additional interfaces, such as a clock interface, clock-enable interface, or a chip-select interface. Each interface may include one or more links. Each interface may further include a buffer, a bus, or other components. Although only one memory module 120 is shown in FIG. 1, the memory system 100 may include more than one memory module 120.

The memory module 120 includes a number of memory devices 150A-150C, such as DRAM devices. Although three memory devices 150A-150C are shown in FIG. 1, the memory module 120 may include more or fewer memory devices. Each memory device 150A-150C stores data that is written to the memory device 150A-150C by the controller 110 via the DQ interface 140 (with a write command from the controller 110 via the CA interface 130) and that can be read from the memory device 150A-150C by the controller 110 via the DQ interface 140 (with a read command from the controller 110 via the CA interface 130).

When a write command is transmitted from the controller 110 to different memory devices 150A-150C, the amount of time taken for the command to traverse the CA interface 130 and arrive at the memory devices 150A-150C is variable due to the different positions of the different memory devices 150A-150C. The variation may be multiple clock cycles. The controller 110 includes a number of delay elements 160A-160C to delay transmission of data over the DQ interface 140 in order to synchronize earlier written data with later written data. Each delay element 160A-160C stores a delay value indicative of any amount of delay the delay element 160A-160C applies to the data transmitted over the DQ interface 140 after the data is processed by other logic 112. The delay values may be set by the controller 110.

In order to determine what the delay values should be set to, in one embodiment, the controller 110 writes a specific pattern of data to each of the memory devices 150A-150C and reads the data from the memory devices 150A-150C. By determining how much the specific pattern has shifted for each memory device 150A-150C, the controller 110 can determine a set of delay values. It may be assumed that the read path delay is already calibrated.

For example, the controller 110 may write '01101010' to each memory device 150A-150C. The first memory device 150A may return an unshifted version of the data (e.g., '01101010'). The second memory device 150B may return a one-bit shifted version of the data (e.g., 'X0110101', where 'X' can be either a one or a zero). The third memory device 150C may return a two-bit shifted version of the data (e.g., 'XX011010'). Thus, the controller may delay data written to the first memory device 150A by two bits, the second memory device 150B by one bit, and not delay the third memory device 150C at all to synchronize the write data. In one embodiment, the delay for each bit may be a full clock cycle if the memory system 100 operates at one-bit-per-cycle. In another embodiment, the delay for each bit is half a clock cycle if the memory system 100 operates at two-bits-per-cycle (e.g., where data is transferred on the leading and trailing edge of the clock waveform).

Each memory device 150A-150C includes a reference voltage (Vref) register 152A-152C for storing a value of a reference voltage. The memory device 150A-150C uses the value stored in the Vref register 152A-152C to set a data input receiver reference voltage. If the reference voltage is incorrectly set, a memory device may, for example, store a '1' when a '0' has been written to the memory device (or vice versa). The value of the reference voltage stored in the Vref register 152A-152C may be set by the controller 110 transmitting a command over the CA interface 130.

In order to determine what the reference voltage values should be set to, in one embodiment, the controller 110 sets the reference voltage value of memory devices 150A-150C to a test value, writes a specific pattern of data to the memory devices 150A-150C, and reads the data from the memory devices 150A-150C. By determining whether the read data matches the written data, the controller 110 can determine whether the test value is a correct value or whether a different value should be tested. This process may be repeated until the read data matches the written data and a correct reference voltage value is determined.

Determining the delay values, as described above, depends on the corresponding reference voltages being correctly set. Similarly, determining the correct reference voltage value using a generic pattern of data depends on the delay being known. For example, if the pattern '01101010' is written to a memory device 150A-150C and the memory device 150A-150C returns '01001101', it may be a three-bit shifted version of the data or it may be gibberish created as the result of an incorrect reference voltage value.

Described below is a method of determining a reference voltage value for a memory device 150A-150C by writing a low-frequency data pattern and performing a density check on a read portion of the data. Unlike the raw read data in the embodiment described above, the density check on the portion of the low-frequency pattern is independent of the delay and can be used to determine the reference voltage value when the delay is unknown. Further, by using the determined reference voltage value, the delay can be also be determined.

Figure 2:
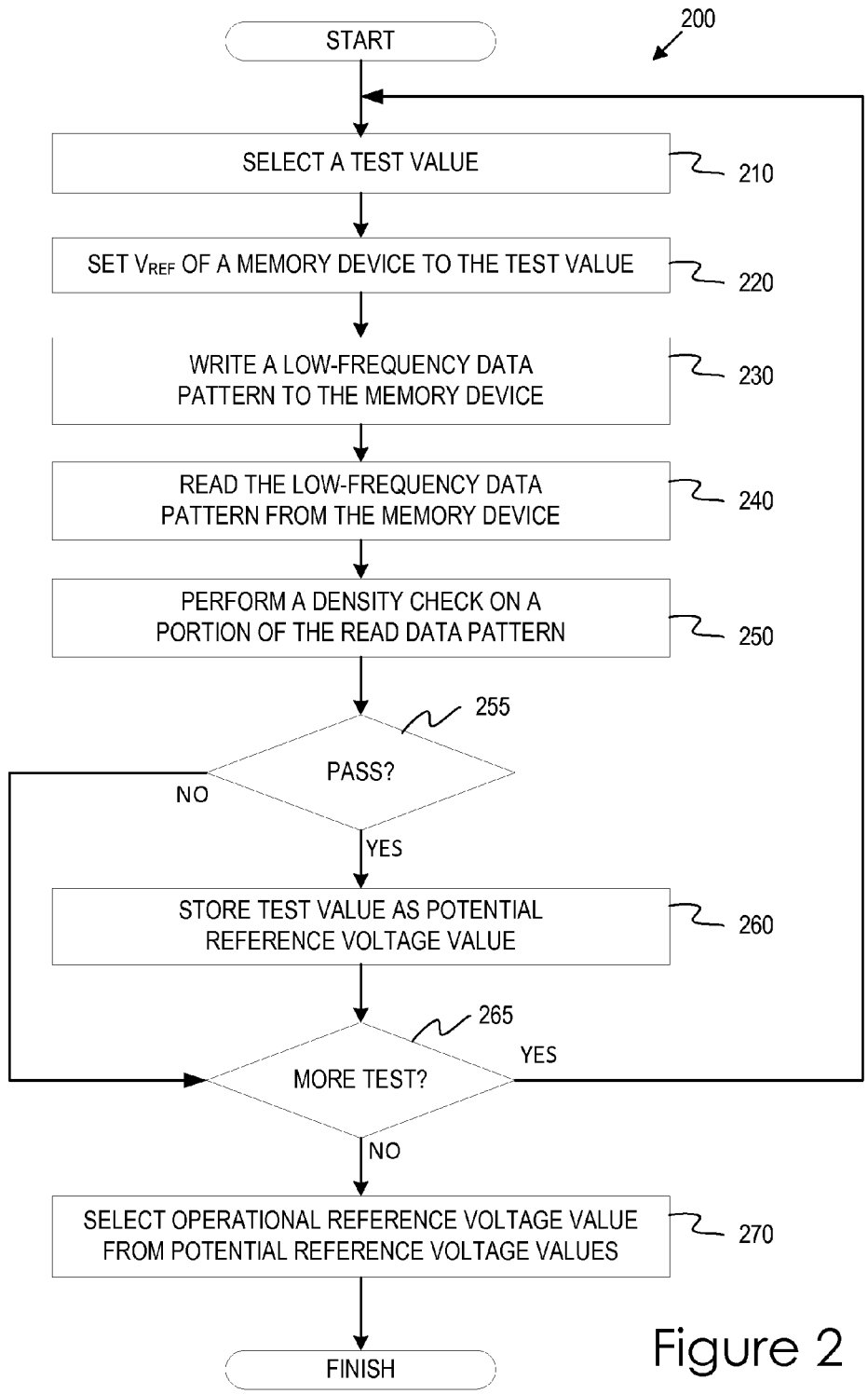
FIG. 2 is a flowchart of a method of determining an operational reference voltage value for a memory device.

FIG. 2 is a flowchart of a method 200 of determining an operational receiver reference voltage value for a memory device. The method 200 may be performed by processing logic that may include hardware (e.g., circuitry, dedicated logic, programmable logic, microcode, etc.), software (e.g., instructions executed by a processing device), firmware or a combination thereof. For example, the method 200 may be performed by the controller 110 of FIG. 1.

The method 200 begins at block 210 with processing logic selecting a test value. The test value may be selected such that, over the course of the method 200, a range of test values are selected. Thus, selecting the test value may include selecting an initial test value during a first iteration and increasing (or decreasing) the test value in subsequent iterations until a final test value is used. In one embodiment, the initial test value is set to 0.4 V and, in subsequent iterations, the test value is increased in steps of 8 mV until a final test value of 0.9 V is used.

At block 220, the processing logic sets a reference voltage value of a memory device to the test value. The processing logic may set the reference voltage value by sending a command to a memory device (e.g., one of the memory device 150A-150C of FIG. 1). The command may change a reference voltage value in a Vref register of the memory device.

At block 230, the processing logic writes a low-frequency data pattern to the memory device. The low-frequency data pattern includes alternating sequences of multiple like bits. For example, in one embodiment, the low-frequency data pattern is a ⅛-rate sequence of 32 bits (e.g., '11111111 00000000 11111111 00000000'). In another embodiment, the low-frequency data pattern is a quarter-rate sequence of 32 bits (e.g., '11110000 11110000 11110000 11110000'). In another embodiment, the low-frequency data pattern is a half-rate sequence of 16 bits (e.g., '11001100 11001100').

Writing the low-frequency data pattern to the memory device may include multiple write commands. For example, if the low-frequency data pattern is '00000000 11111111 00000000 11111111', this may be written to the memory device with four write commands of eight bits each.

At block 240, the processing logic reads the data pattern from a memory device. FIG. 3 shows an example low-frequency data pattern that may be written to the memory device and various examples of the read data pattern that may be read from the memory device. The written low-frequency data pattern 300 is a ⅛-rate sequence of 32 bits (e.g., '11111111 00000000 11111111 00000000').

If the test voltage is not a working reference voltage, the read data pattern may be unrelated to the written data pattern. For example, the read data pattern may be random bits, all zeroes, all ones, or otherwise unrelated to the written data pattern. In a first example, the read data pattern 310 is random bits (e.g., '11001010 01110011 01001111 01100001').

If the test voltage is a working reference voltage, the read data pattern may be a shifted version of the written data pattern. In a second example, the read data pattern 320 is a version of the written data pattern that has been shifted two bits (e.g., '11111100 00000011 11111100 00000010'). The first two bits of the written data pattern (e.g., '11') have not been read and the last two bits of the read data pattern (e.g., '10') are arbitrary.

In a third example, the read data pattern 330 is a version of the written data pattern that has been shifted six bits (e.g., '11000000 00111111 11000000 00000000'). The first six bits of the written data pattern have not been read and the last six bits of the read data pattern are arbitrary (in this example, all zeroes).

Returning to FIG. 2, at block 250, the processing logic performs a density check on a portion of the read data pattern. In one embodiment, the density check is performed on a middle portion of the read data pattern. For example, if the data pattern is 32 bits, the density check may be performed on the middle 16 bits (e.g., the ninth through twenty-fourth bits) or the middle 8 bits.

At block 255, the processing logic determines if the portion of the read data pattern passes the density check. If the processing logic determines that the portion passes the density check, the method 200 continues at block 260 where the processing logic stores the test value as a potential reference voltage value before continuing to block 265. If the processing logic determines that the portion does not pass the density check, the method 200 skips to block 265.

In one embodiment, the processing logic performs the density check (at block 250) by determining the number of ones and the number of zeroes of the portion of the read data pattern and determines if the portion of the read data pattern passes the density check (in block 255) by determining if the number of ones equals the number of zeroes.

For example, referring to FIG. 3, the processing logic may perform the density check on the middle portion 311 of the first example read data pattern 310 and determine that there are ten ones and six zeroes and determine that the density check is not passed. The processing logic may perform the density check on the middle portion 321 of the second example read data pattern 320 and determine that there are eight ones and eight zeroes and determine that the density check is passed.

In another embodiment, the processing logic performs the density check (at block 250) by determining the number of ones or the number of zeroes of the portion of the read data pattern and determines if the portion of the read data pattern passes the density check (in block 255) by determining if the number matches an expected number. For example, the written data pattern may be '00000000 00000001 00000000' and the read data pattern (when the test value is a working reference value) may be '00000000 00001000 00000101'. The read data pattern is a version of the written data pattern shifted by three bits. Thus, the final three bits of the read data pattern are arbitrary. The processing logic may perform the density check on the middle eight bits and determine that there is the expected number of ones (e.g., only one '1') and that the density check is passed.

Returning to FIG. 2, at block 265, the method 200 returns to block 210 if there are additional test values to be tested and otherwise continues to block 270. At block 270, the processing logic selects an operational reference voltage value based on the potential reference voltage values stored at block 270. In one embodiment, the operational reference voltage value is selected as the median of the potential reference voltage values. In another embodiment, the operational reference voltage value is selected as the average of the highest and lowest potential reference voltage values. The operational reference voltage value may be selected based on the potential reference voltage values using other techniques.

Although the method 200 is described above with respect to a single memory device, it is to be appreciated that the method 200 could be performed for multiple memory devices simultaneously. For example, the processing logic may set a $V_{REF}$ of multiple memory devices to the test value selected in block 210 and determine, at block 255, for each of the multiple memory devices, whether the test value should be stored as a potential reference voltage value of the memory device. Similarly, at block 270, the processing logic may select an operational reference voltage value for each of the memory devices. The operational reference voltage may be same or different for different memory devices.

Figure 4:
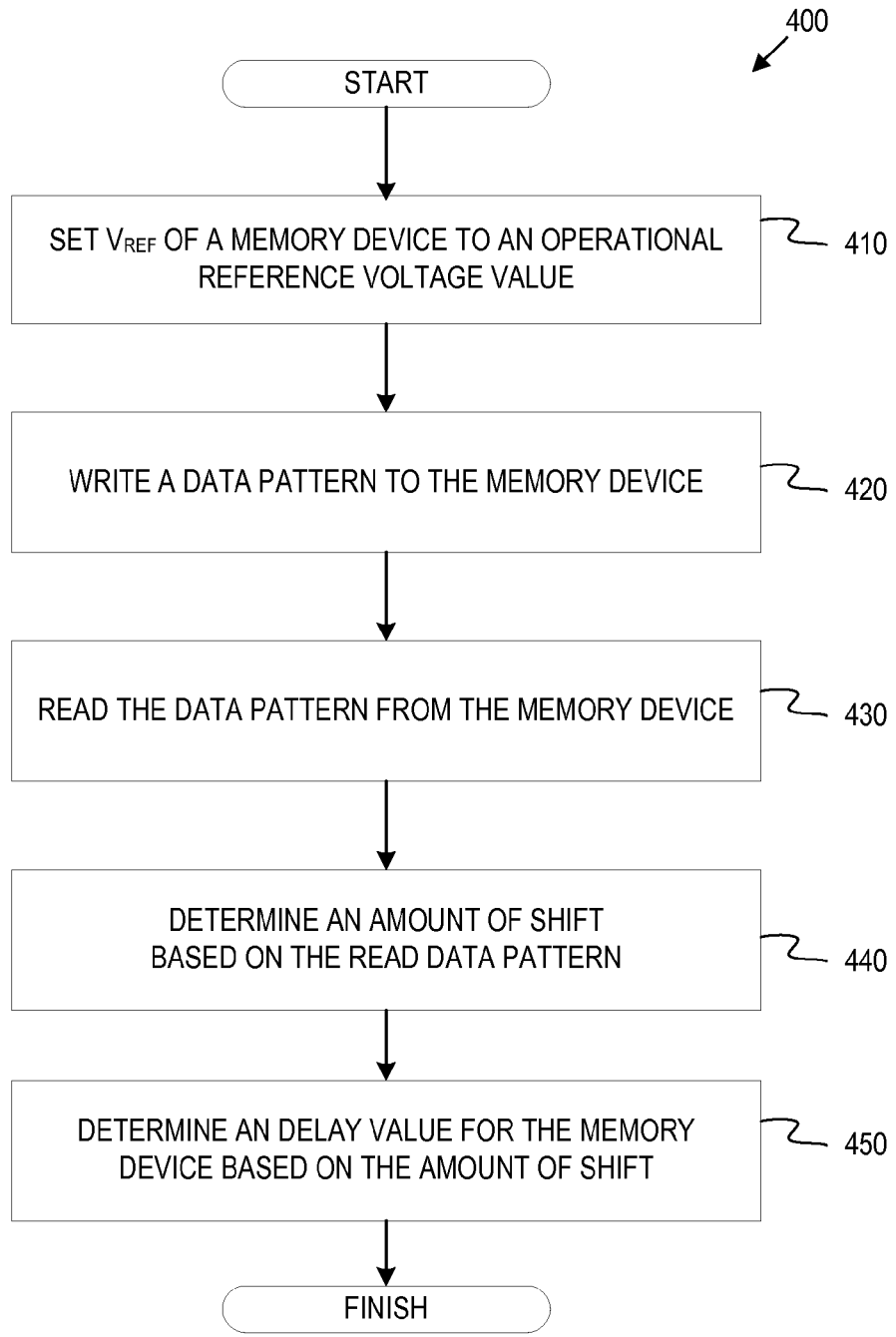
FIG. 4 is a flowchart of a method 400 of determining a delay value for a memory device.

FIG. 4 is a flowchart of a method 400 of determining a delay value for a memory device. The method 400 may be performed by processing logic that may include hardware (e.g., circuitry, dedicated logic, programmable logic, microcode, etc.), software (e.g., instructions executed by a processing device), firmware or a combination thereof. For example, the method 400 may be performed by the controller 110 of FIG. 1. Although the method 400 is described below with respect to a single memory device, it is to be appreciated that the method 400 could be performed for multiple memory devices simultaneously.

The method 400 begins at block 410 with processing logic setting a reference voltage value of a memory device to an operational reference voltage value. The operational reference voltage value may be determined as described above with respect to FIG. 2. The processing logic may set the reference voltage value by sending a command to a memory device (e.g., one of the memory device 150A-150C of FIG. 1). The command may change a reference voltage value in a Vref register of the memory device.

At block 420, the processing logic writes a data pattern to the memory device. In one embodiment, the written data pattern is a low-frequency data pattern. Writing the data pattern may include multiple write commands. For example, if the data pattern is '00000000 11111111 00000000 11111111', this may be written to the memory device with four write commands of eight bits each on every DQ pin.

At block 430, the processing logic reads the data pattern from memory device. As described above, FIG. 3 shows an example low-frequency data pattern that may be written to the memory device and various examples of the read data pattern that may be read from the memory device. The written low-frequency data pattern 300 is a ⅛-rate sequence of 32 bits (e.g., '11111111 00000000 11111111 00000000').

Because the operational reference voltage is a working reference voltage, the read data pattern is likely to be related to written data pattern as shown in read data pattern 310. Rather, the read data pattern may be a shifted version of the written data pattern, e.g. the two-bit-shifted read data pattern 320 or the six-bit-shifted read data pattern 330.

At block 440, the processing logic determines an amount of shift based on the read data pattern. The processing logic may determine the amount of shift by comparing the read data pattern to shifted versions of the written data pattern. In one embodiment, shifted versions of the written data pattern are stored in a table and comparing the read data pattern to the shifted versions comprises determining which entry of the table matches the read data pattern.

In one embodiment, the processing logic determines the amount of shift by comparing a portion of the read data pattern to portions of shifted versions of the written data patterns. For example, the processing logic may determine the amount of shift by comparing a middle portion of the read data pattern to middle portions of the shifted data pattern. The middle portion may be, for example, the middle 16 bits of a 32-bit data pattern. In one embodiment, shifted versions of the middle portion of the written data pattern are stored in a table and determining the shift comprises determining which entry of the table matches the middle portion of the read data pattern. FIG. 5 shows an example look-up data for the written data pattern of FIG. 3.

The shift may be determined in other ways. For example, using a low-frequency data pattern, such as the written data pattern 310 of FIG. 3, the shift may be determined by determining the number of ones or zeros in a first half of the middle portion of the read data (e.g., the first eight bits of the middle portion) As another example, using a low-frequency data pattern, such as the written data pattern 310 of FIG. 3, the shift may be determined by determining the location of an edge in the middle portion of the read data pattern (e.g., the first one or zero of the middle portion).

As mentioned above, the written data pattern may be selected as a low-frequency data pattern. In another embodiment, the written data pattern may be selected to be error-resistant, such that read data patterns that are noisy shifted versions of the written data pattern can be matched to shifted versions of the written data pattern without error. For example, the written data pattern may be '01 0011 000111 00001111'.

At block 450, the processing logic determines a delay value for the memory device based on the amount of shift. For example, the delay value (D) for a particular memory device may be determined as maximum shift experienced by any memory device of a memory module ($S_{MAX}$) minus the shift experienced by the particular memory device (S). Thus, if a first memory device is determined to have no shift, a second memory device is determined to have a shift of one bit, and a third memory devices is determined to have a shift of two bits, the delay value for the first memory device may be two bits, the delay value for the second memory device may be one bit, and the delay value for the third memory device may be zero.

Although the determination of an operational reference voltage value and a delay for a memory device are described separately with respect to FIGS. 2 and 4, in one embodiment, the operational reference voltage value and the delay are determined together. For example, determining an amount of shift based on a read data pattern (as described with respect to block 440 of FIG. 4) may be performed based on the data pattern read in block 240 of FIG. 2 and stored along with the potential reference voltage value in block 260. If that potential reference voltage value is selected as the operational reference voltage value for the memory device in block 270, the shift may be used to determine a delay for the memory device (as described with respect to block 450 of FIG. 4). The operations of FIGS. 2 and 4 may be combined and reordered in other ways.

Figure 6:
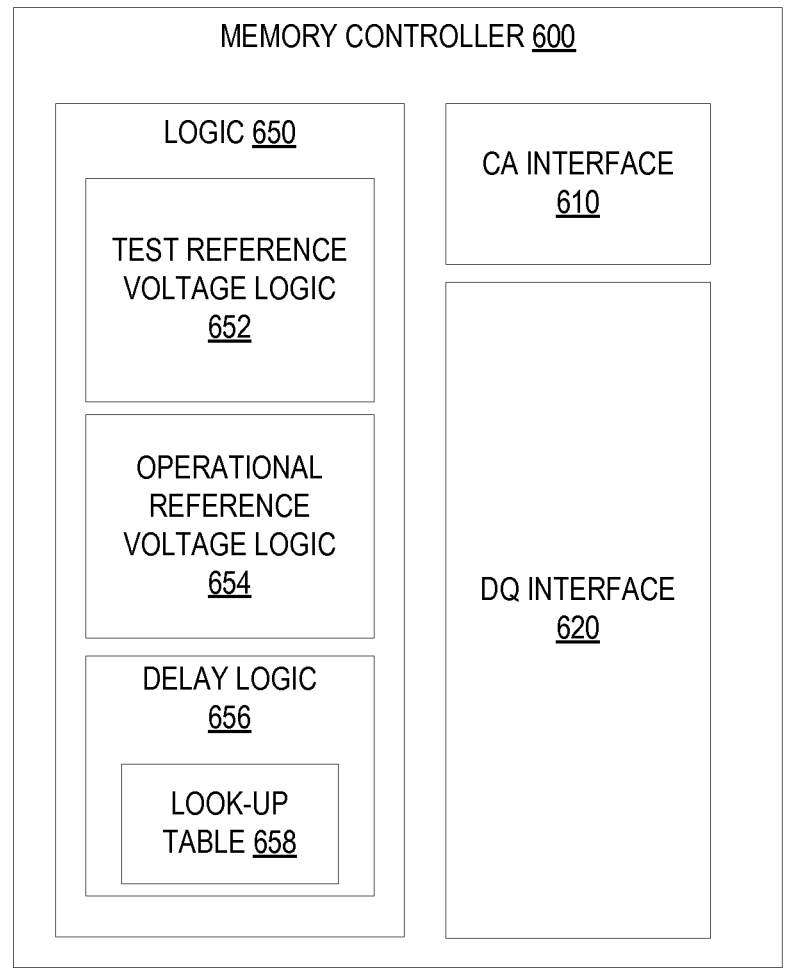
FIG. 6 is a functional block diagram of a memory controller.

FIG. 6 is a functional block diagram of a memory controller 600. The memory controller 600 may correspond to the memory controller 110 of FIG. 1. The memory controller 600 includes a command-address (CA) interface 610 for sending commands to one or more memory devices of a memory module. The CA interface 610 may, for example, send a command to a memory device to set a reference voltage value of the memory device. The memory device may include a reference voltage register to store the reference voltage value and use it to determine whether a voltage associated with a bit of data received from the memory controller indicates that the bit is a '1' or a '0'. In particular, the CA interface 610 may send a command to a memory device to set a reference voltage value of the memory device to a test value.

The memory controller 600 includes a data (DQ) interface 620 for transmitting/receiving data to one or more memory device. In particular, the DQ interface 620 may transmit a first data pattern to a memory device and receive the first data pattern from the memory device. The first data pattern may be a low-density data pattern. The first data pattern may be alternating sequences of multiple like bits. For example, the first data pattern may be four consecutive sequences of eight like bits.

The memory controller 600 includes logic 650 for performing memory operations such as those described above with respect to FIGS. 2 and 4. The logic 650 includes test reference voltage logic 652 to perform a density check on at least a portion of a first data pattern received (i.e., read) from the memory device and to determine whether the test value (set using the CA interface 610) is a potential reference voltage value based on the density check.

The logic 650 further includes operational reference voltage value logic 652 to determine an operational reference voltage value for a memory device based on test values determined as potential reference voltage values for the memory device. The CA interface 610 may send a command to the memory device setting a value in a reference voltage register to the operational reference voltage value.

The logic 650 further includes delay logic to determine a delay for a memory device based on at least a portion of a second data pattern written to the memory device and read from the memory device using the DQ interface 620. The second data pattern may be the same or different from the first data pattern described above.

Figure 7:
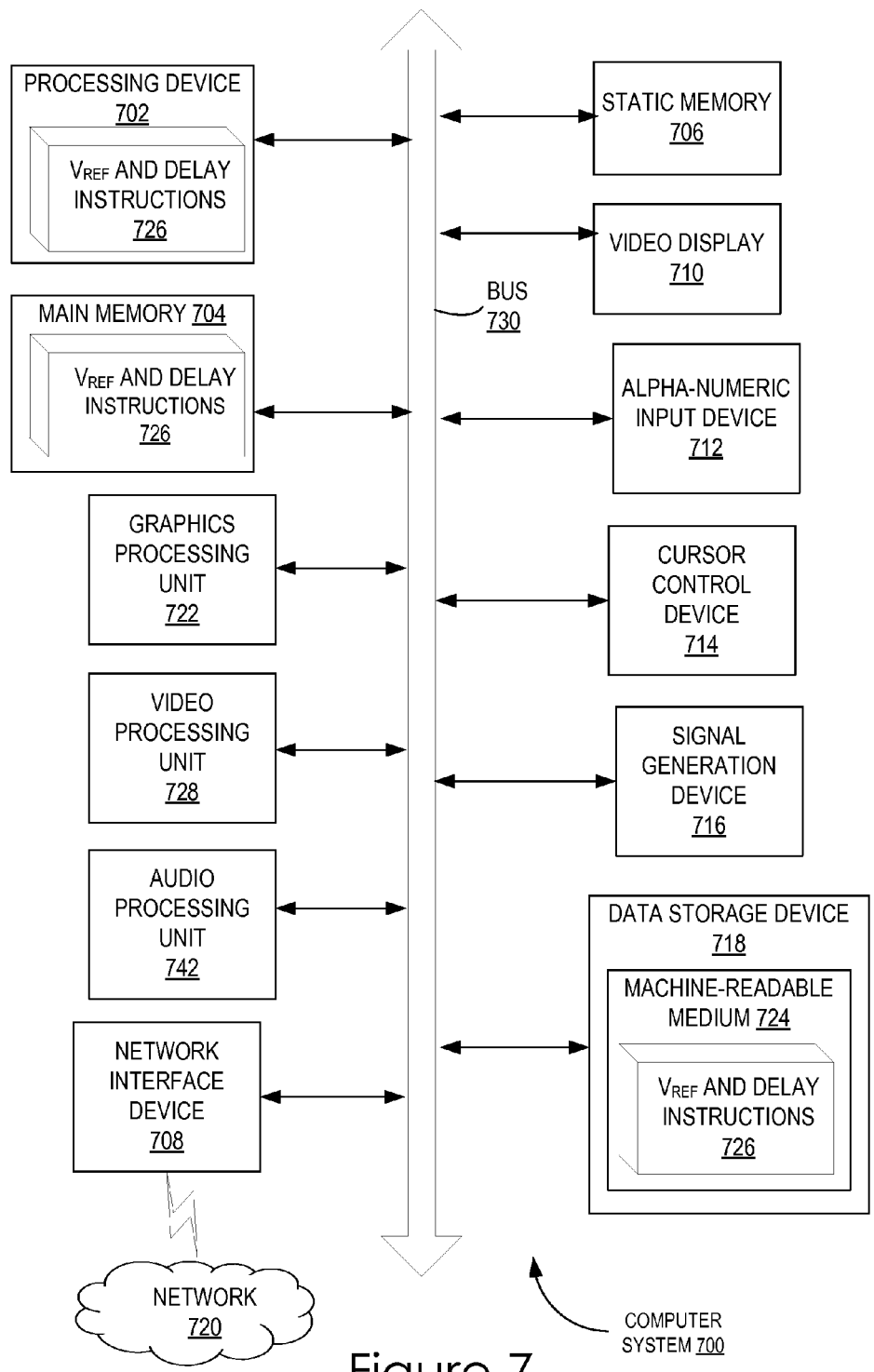
FIG. 7 is a block diagram of a computer system according to one embodiment.

FIG. 7 illustrates a diagrammatic representation of a machine in the exemplary form of a computer system 700 within which a set of instructions, for causing the machine to perform any one or more of the methodologies discussed herein, may be executed. The system 700 may be in the form of a computer system within which a set of instructions, for causing the machine to perform any one or more of the methodologies discussed herein, may be executed. In alternative embodiments, the machine may be connected (e.g., networked) to other machines in a LAN, an intranet, an extranet, or the Internet. The machine may operate in the capacity of a server machine in client-server network environment. The machine may be a personal computer (PC), a set-top box (STB), a server, a network router, switch or bridge, or any machine capable of executing a set of instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein. In one embodiment, computer system 700 may include the memory system 100 of FIG. 1.

The exemplary computer system 700 includes a processing device (processor) 702, a main memory 704 (e.g., read-only memory (ROM), flash memory, dynamic random access memory (DRAM) such as synchronous DRAM (SDRAM)), a static memory 706 (e.g., flash memory, static random access memory (SRAM)), and a data storage device 718, which communicate with each other via a bus 730.

Processing device 702 represents one or more general-purpose processing devices such as a microprocessor, central processing unit, or the like. More particularly, the processing device 702 may be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device 702 may also be one or more special-purpose processing devices such as an application specific integrated circuit (ASIC), a field programmable gate array (FPGA), a digital signal processor (DSP), network processor, or the like. The processing device 702 is configured to execute the reference voltage and delay instructions 726 for performing the operations and steps discussed herein, e.g., with respect to FIGS. 2 and 4.

The computer system 700 may further include a network interface device 708. The computer system 700 also may include a video display unit 710 (e.g., a liquid crystal display (LCD) or a cathode ray tube (CRT)), an alphanumeric input device 712 (e.g., a keyboard), a cursor control device 714 (e.g., a mouse), and a signal generation device 716 (e.g., a speaker).

The data storage device 718 may include a computer-readable medium 728 on which is stored one or more sets of instructions 726 (e.g., instructions to perform method 200 of FIG. 2 or method 400 of FIG. 4) embodying any one or more of the methodologies or functions described herein. The instructions 726 may also reside, completely or at least partially, within the main memory 704 and/or within processing logic of the processing device 702 during execution thereof by the computer system 700, the main memory 704 and the processing device 702 also constituting computer-readable media. The instructions may further be transmitted or received over a network 720 via the network interface device 708.

While the computer-readable storage medium 724 is shown in an exemplary embodiment to be a single medium, the term "computer-readable storage medium" or "computer-readable medium" should be taken to include a single medium or multiple media (e.g., a centralized or distributed database, and/or associated caches and servers) that store the one or more sets of instructions. The term "computer-readable storage medium" shall also be taken to include any medium that is capable of storing, encoding or carrying a set of instructions for execution by the machine and that cause the machine to perform any one or more of the methodologies of the present invention. The term "computer-readable storage medium" shall accordingly be taken to include, but not be limited to, solid-state memories, optical media, and magnetic media.

Figure 8:
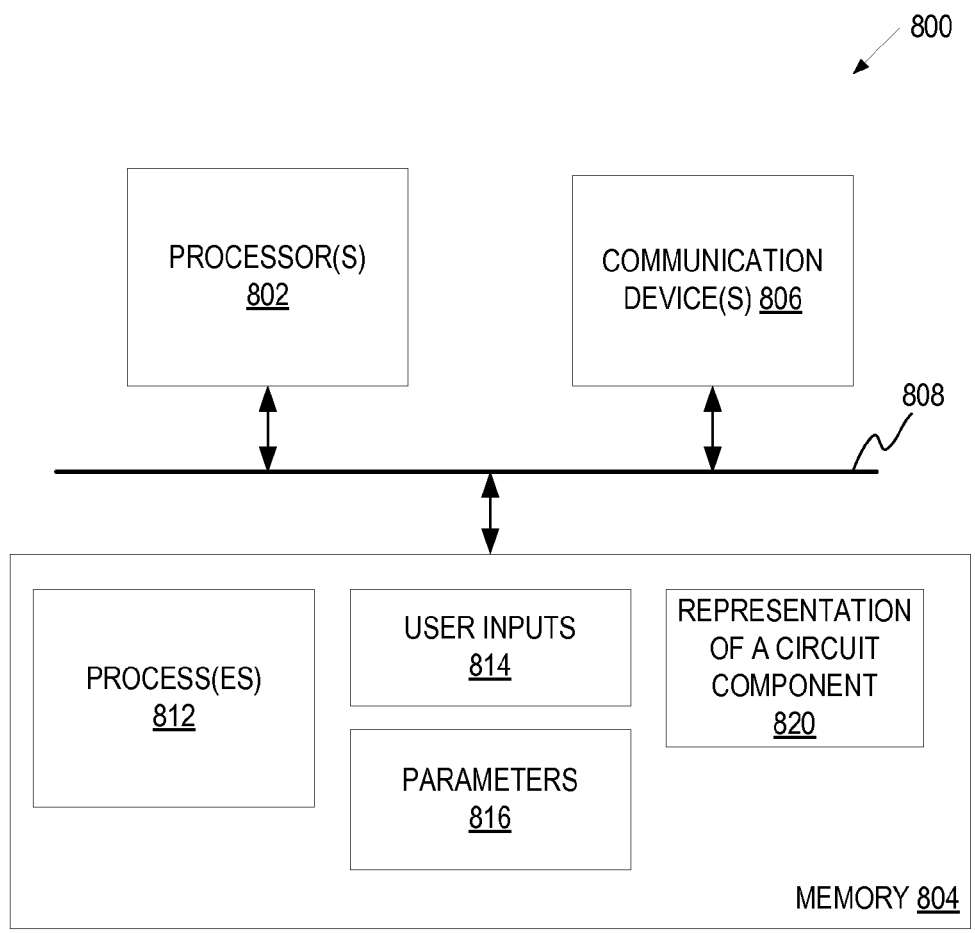
FIG. 8 is a block diagram illustrating one embodiment of a processing system for processing or generating a representation of a circuit component.

FIG. 8 is a block diagram illustrating one embodiment of a processing system 800 for processing or generating a representation of a circuit component 820. Processing system 800 includes one or more processors 802, a memory 804, and one or more communications devices 806. Processors 802, memory 804, and communications devices 806 communicate using any suitable type, number, and/or configuration of wired and/or wireless connections 808.

Processors 802 execute instructions of one or more processes 812 stored in a memory 804 to generate and/or process representation 820 responsive to user inputs 814 and parameters 816. Processes 812 may be any suitable type, number, and/or configuration of electronic design automation (EDA) tools or portions thereof used to design, simulate, analyze, and/or verify electronic circuitry and/or prepare electronic circuitry for manufacturing (e.g., by generating one or more representations 820 used to create one or more photomasks). Representation 820 includes data that describes all or selected portions of circuits 100 or 600 as shown in FIGS. 2 and 6 in any suitable format. Examples of such formats include a netlist, a hardware description language format, a field-programmable gate array bitstream, a library format, a simulation format, and a physical design (e.g., a layout or computer-aided design (CAD) file) format. In some embodiments, one or more processes 812, when executed by processors 802, may access a representation 820 of a first type, convert the representation 820 to a second type, and store the second type of representation in memory 804 or another suitable memory (not shown) via communications devices 806.

Memory 804 includes any suitable type, number, and/or configuration of non-transitory computer-readable storage media that store processes 812, user inputs 814, parameters 816, and representation 820. User inputs 814 may be received from any suitable source such as a keyboard, a mouse, and/or a touchscreen. Parameters 816 may include electronic circuit libraries, design policies, process rules, and/or other information used by one or more processes 812 to generate and/or process representation 1020.

Communications devices 806 include any suitable type, number, and/or configuration of wired and/or wireless devices that transmit information from processing system 800 to another processing or storage system (not shown) and/or receive information from another processing or storage system (not shown). For example, communications devices 806 may transmit representation 820 to another system (not shown). Communications devices 806 may also receive processes 812, user inputs 814, parameters 816, and/or circuit component 820 from another system (not shown) and cause processes 812, user inputs 814, parameters 816, and/or circuit component 820 to be stored in memory 804.

The preceding description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the scope of the present invention.

Some portions of the detailed description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "determining", "generating", or the like, refer to the actions and processes of a computer system, or similar electronic computing device, that manipulates and transforms data represented as physical (e.g., electronic) quantities within the computer system's registers and memories into other data similarly represented as physical quantities within the computer system memories or registers or other such information storage, transmission or display devices.

Embodiments of the invention also relate to an apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions.

The algorithms and displays presented herein are not inherently related to any particular computer or other apparatus. Various general purpose systems may be used with programs in accordance with the teachings herein, or it may prove convenient to construct a more specialized apparatus to perform the required method steps. The required structure for a variety of these systems will appear from the description below. In addition, the present invention is not described with reference to any particular programming language. It will be appreciated that a variety of programming languages may be used to implement the teachings of the invention as described herein.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A method comprising:
    sending, by a memory controller, a command to a memory device, the command to cause the memory device to set a reference voltage value of the memory device to a test value;
    writing, by the memory controller, a first data pattern to the memory device;
    reading, by the memory controller, the first data pattern from the memory device;
    performing, by the memory controller, a density check on at least a portion of the first data pattern read from the memory device; and
    determining, by the memory controller, that the test value comprises a potential reference voltage value for the memory device when the at least the portion of the first data pattern passes the density check.

2. The method of claim 1, further comprising, for each of one or more additional test values:
    setting the reference voltage value of the memory device to the additional test value;
    writing the first data pattern to the memory device;
    reading the first data pattern from the memory device;
    performing a density check on at least a portion of the first data pattern read from the memory device; and
    determining whether the additional test value is a potential reference voltage value based on the density check.

3. The method of claim 2, further comprising, determining an operational reference voltage value based on the test values determined as potential reference voltage values.

4. The method of claim 3, further comprising:
    setting the reference voltage value of the memory device to the operational reference voltage value;
    writing a second data pattern to the memory device;
    reading the second data pattern from the memory device;
    determining a delay for the memory device based on at least a portion of the second data pattern read from the memory device.

5. The method of claim 1, wherein performing the density check comprises determining a number of ones and a number of zeroes in the portion of the first data pattern read from the memory device.

6. The method of claim 5, wherein determining whether the additional test value is a potential reference voltage value based on the density check comprises determining if the number of ones is equal to the number of zeroes.

7. The method of claim 1, wherein the first data pattern comprises a low-frequency data pattern.

8. The method of claim 1, wherein the first data pattern comprises alternating sequences of multiple like bits.

9. The method of claim 1, wherein the first data pattern comprises four consecutive sequences of eight like bits.

10. A system comprising:
    a memory device comprising a reference voltage register to store a reference voltage value used to determine whether a voltage associated with a bit of data received by the memory device indicates that the bit is a '1' or a '0';
    a memory controller coupled to the memory device, the memory controller to:
        send a command to the memory device, the command to cause the memory device to set the reference voltage value to a test value;
        write a first data pattern to the memory device;
        read the first data pattern from the memory device;
        perform a density check on at least a portion of the first data pattern read from the memory device; and
        determine that the test value is comprises a potential reference voltage value when the at least the portion of the first data pattern passes the density check.

11. The system of claim 10, wherein the memory controller is to set the reference voltage value to a test value by transmitting a command to the memory device over a command-address (CA) interface.

12. The system of claim 10, wherein the memory controller is to write the first data pattern to the memory device and read the first data pattern from the memory device over a data (DQ) interface.

13. The system of claim 10, wherein the memory device comprises a dynamic random access memory (DRAM) device.

14. The system of claim 10, wherein the memory controller is further to, for each of one or more additional test values:
    set the reference voltage value of the memory device to the additional test value;
    write the first data pattern to the memory device;
    read the first data pattern from the memory device;
    perform a density check on at least a portion of the first data pattern read from the memory device; and
    determine whether the additional test value is a potential reference voltage value based on the density check.

15. The system of claim 13, wherein the memory controller is further to:
    determine a final reference voltage value based on the test values determined as potential reference voltage values.

16. The system of claim 15, wherein the memory controller is further to:
    set the reference voltage value of the memory device to the final reference voltage value;
    write a second data pattern to the memory device;
    read the second data pattern from the memory device; and
    determine a delay for the memory device based on at least a portion of the second data pattern read from the memory device, wherein the second data pattern is the same or different from the first read pattern.

17. A memory controller comprising:
    a command-address interface to send a command to a memory device to set a reference voltage value of the memory device to a test value;
    a data interface to write a first data pattern to the memory device and read the first data pattern from the memory device;
    test reference voltage logic to perform a density check on at least a portion of the first data pattern read from the memory device and determine that the test value comprises a potential reference voltage value for the memory device when the at least the portion of the first data pattern passes the density check.

18. The memory controller of claim 17, further comprising operational reference voltage logic to determine an operational reference voltage value based on test values determined as potential reference voltage values.

19. The memory controller of claim 18, further comprising delay logic to determine a delay for the memory device based on at least a portion of a second data pattern written to the memory device and read from the memory device using the data interface.

20. The memory controller of claim 17, wherein the first data pattern comprises four consecutive sequences of eight like bits.

* * * * *